United States Patent
Lin

Patent No.: US 6,218,303 B1
Date of Patent: Apr. 17, 2001

(54) VIA FORMATION USING OXIDE REDUCTION OF UNDERLYING COPPER

(75) Inventor: Xi-Wei Lin, Freemont, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/209,616

(22) Filed: Dec. 11, 1998

(51) Int. Cl.[7] .................................................. H01L 21/44
(52) U.S. Cl. ........................ 438/687; 438/618; 438/627; 438/660
(58) Field of Search ..................... 438/687, 688, 438/722, 706, 660, 618, 627, 689, DIG. 906

(56) References Cited

U.S. PATENT DOCUMENTS

| Re. 29,771 | * | 9/1978 | Cull et al. ......................... 252/455 |
| 4,085,195 | * | 4/1978 | Cull et al. ......................... 423/244 |
| 4,129,523 | * | 12/1978 | Snowden ........................... 252/475 |
| 4,321,284 | * | 3/1982 | Yakushiji . | |
| 4,842,891 | * | 6/1989 | Miyazaki et al. ................... 427/35 |
| 5,019,531 | * | 5/1991 | Awaya et al. ..................... 437/180 |
| 5,269,878 | * | 12/1993 | Page et al. . | |
| 5,436,410 | * | 7/1995 | Jain et al. . | |
| 5,472,825 | * | 12/1995 | Sayka . | |
| 5,527,739 | * | 6/1996 | Parrillo et al. ................... 437/198 |
| 5,654,232 | * | 8/1997 | Gardner ........................... 438/661 |
| 5,731,634 | * | 3/1998 | Matsuo et al. .................... 257/752 |
| 5,891,803 | * | 4/1999 | Gardner . | |
| 5,939,334 | * | 8/1999 | Nguyen et al. . | |

OTHER PUBLICATIONS

J.J. Moore et al., Chemical Metallurgy, p60–87, 1981.*
Terkel Rosenqvist, Principles of Extractive Metallurgy, second edition, p 236–243, 482, 1983.*
C.H.P. Lupis, Chemical Thermodyanmics of Materials, p132–137, 512, 1983.*
David R. Gaskell, Introduction to Metallurgical Thermodyanmics, second edition, p261–299, 1981.*

* cited by examiner

Primary Examiner—Charles Bowers
Assistant Examiner—Evan Pert
(74) Attorney, Agent, or Firm—Clifton L. Anderson

(57) ABSTRACT

Copper is the bulk interconnect metal in the manufacture of an integrated circuit in accordance with the damascene process. When copper is exposed through via apertures, carbon monoxide and hydrogen are used as reduction agents to convert black copper oxide to red copper oxide and the red copper oxide to copper. The integrated circuit is then transferred in a high vacuum to a sputter chamber so that re-oxidation does not occur before tantalum barrier metal can be deposited. As a result, a good tantalum-copper electrical contact can be made without risking embedding copper in oxide sidewalls (whence it could migrate to active circuit regions and impair device reliability).

10 Claims, 4 Drawing Sheets

VIA FORMATION USING OXIDE REDUCTION OF UNDERLYING COPPER

BACKGROUND OF THE INVENTION

The present invention relates to integrated circuit manufacture and, more particularly, to a method for removing oxide from exposed regions of a conductor pattern. A major objective of the invention is to provide for improved oxide removal of copper conductors exposed through via apertures in manufacturing technologies with features sizes below 0.2 microns.

Much of modern progress is associated with the increasing prevalence of microprocessor-based systems, which has been made possible in part by advances in integrated circuit manufacturing technology. These advances have permitted ever-smaller circuit features to be defined so that more circuit elements can be formed per unit area. This increased circuit density has permitted greater functionality per integrated circuit. Also, since circuit elements are closer together, the speed at which they can communicate is increased. Also, the smaller devices tend to consume less power, so the net result is greater functionality and speed with reduced power consumption.

While there is considerable variety in integrated circuits, a typical integrated circuit comprises a semiconductor substrate in which active circuit elements are defined by patterned doping and an overlaying interconnect structure of plural patterned metal layers insulated from each other and from the substrate by dielectric layers. Connections to the substrate and between metal layers are typically achieved using metal vias that extend through the dielectric material. The prevalent semiconductor material is silicon, the prevalent interconnect metal is aluminum, and the prevalent dielectric material is silicon dioxide. Each of these materials is relatively easy to work with and pattern. Collectively, they work well together in that small amounts of contamination by any of these materials migrating into others is not a major problem for the finished device.

However, as the integrated circuit features shrink with advancing technology, the resistance of the smaller-cross-section aluminum conductors increases, resulting in poor electrical performance and relatively high heat generation. This has led generally to a trend to forsake aluminum in favor of copper to take advantage of the latter's greater conductivity. Copper is harder to pattern than aluminum, but a damascene process has been developed that permits the required patterning.

Another problem with copper is that it is a poison in the context of integrated circuits in the sense that active semiconductor regions can be impaired by the presence of copper. Unless appropriate countermeasures are taken, copper atoms can migrate from the conductors to the semiconductor substrate. This migration can cause an integrated circuit to deteriorate over time-possibly leading to eventual failure. Thus, the use of copper can raise concerns for reliability. This reliability issue is addressed by encasing the copper conductors in barrier materials, e.g., tantalum, to prevent migration of copper atoms.

For example, silicon dioxide dielectric is deposited over a copper pattern. Apertures can be photolithographically defined where vias are to be formed. The apertures expose copper that is to be covered with barrier metal. However, before the barrier metal can be deposited it is necessary to remove any oxidization of the copper to ensure a good metal-to-metal electrical contact.

A comparable situation exists when aluminum conductors are involved since contaminants must be removed from aluminum exposed through via apertures before via metal is deposited. The aluminum is typically cleaned by sputtering through via apertures using a process analogous to sandblasting. However, sputtering when copper is involved can result in copper being embedded in the oxide sidewalls of the vias. These copper atoms escape coverage by the subsequently deposited barrier metal, and thus are a threat to device reliability as they are free to migrate to the active semiconductor regions. In addition, it is difficult to sputter effectively through the high-aspect-ratios apertures associated with smaller feature dimensions. So the sputter method used for cleaning aluminum through apertures does not translate well to copper-based integrated-circuit manufacture. Accordingly, what is needed is a better integrated-circuit manufacturing method that provides for removing oxidation from copper exposed through via apertures.

SUMMARY OF THE INVENTION

The present invention provides for removing copper oxide using a gaseous reducing agent. More specifically, the method involves forming a patterned metal layer including copper, forming a dielectric over the metal layer with via apertures exposing some of the copper, exposing the copper to a gaseous reducing agent, and then depositing barrier metal in the aperture. Preferably the reduction reaction is a two-step reaction, yielding $Cu_2O$ as an intermediate product. The reaction can be conducted at a temperature above 300° C., preferably between 350° C. and 450° C. Exemplary reducing agents are carbon monoxide and hydrogen.

To minimize the opportunities for re-oxidation of the copper prior to deposition of barrier metal, the integrated circuit can be transferred by a robotics system from a reduction chamber to a barrier-metal deposition chamber within a cluster that maintains a high vacuum (less than $10_{-8}$ Torr) in the transfer environment enclosing the two chambers.

After transfer, a barrier metal is deposited over the exposed copper, coating the via apertures, as well as trenches formed according to the preferred damascene process for patterning copper. A seed layer of copper can then be deposited in preparation for bulk electroplating of the copper. Chemical-mechanical polishing can be used to remove metal except within the trenches and vias.

The reduction reaction is far gentler mechanically than is the sputtering process used to clean aluminum. Accordingly, there is less chance for metal atoms to be lodged into via sidewalls, from where they could migrate to the active regions of the semiconductor material. Thus, the invention provides an improvement in reliability relative to similar devices manufactured using sputtering to remove copper oxide. In addition, the high-aspect-ratio via apertures associated with decreasing feature dimensions interfere less with a reduction reaction than a sputtering process. These and other features and advantages of the invention are apparent from the description below with reference to the following drawings.

DESCRIPTION OF THE PREFERRED EMBODIMENTS

Figure 1:
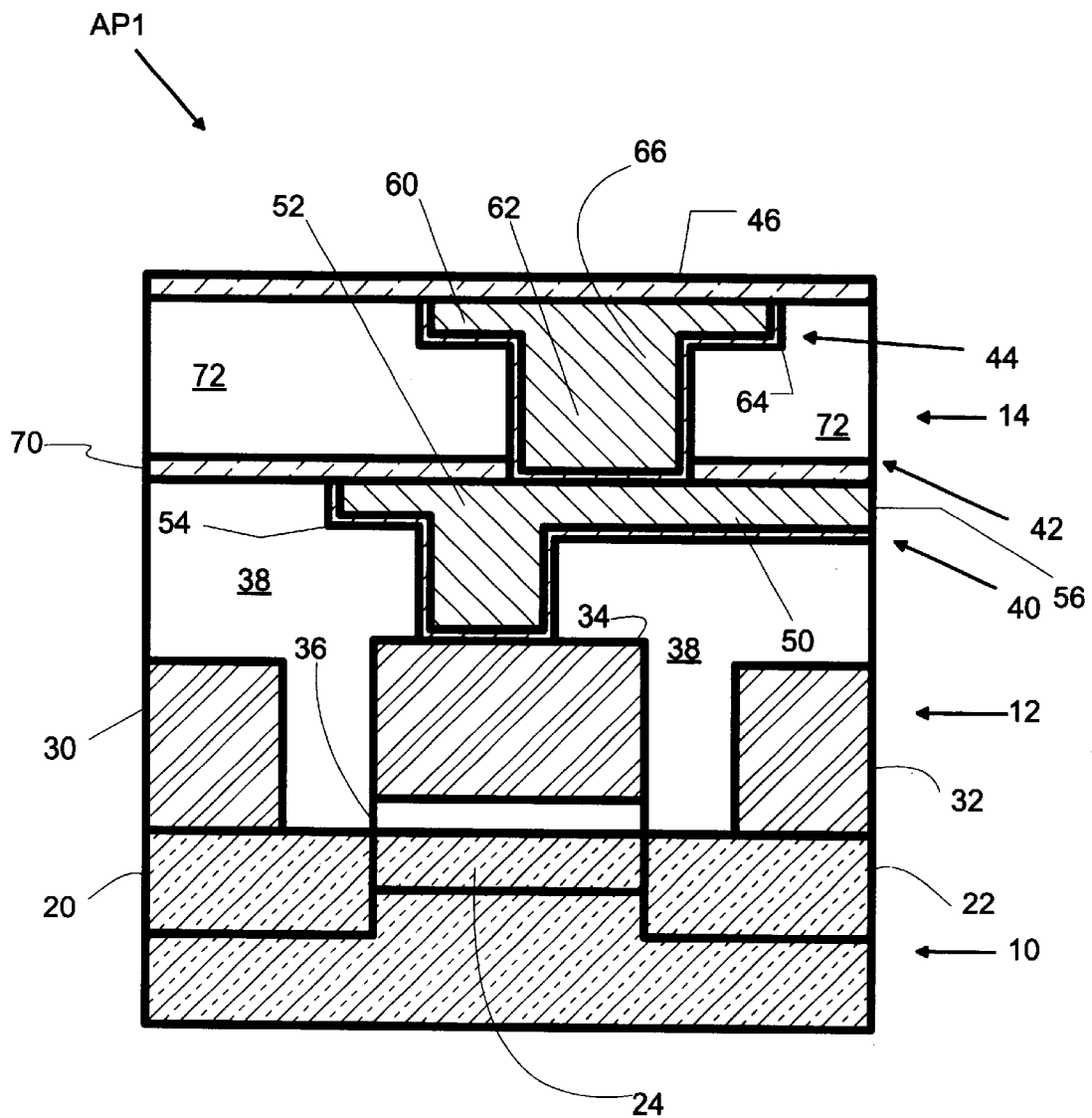
FIG. 1 is a schematic illustration of an integrated circuit manufactured in accordance with the present invention.

An integrated circuit AP1 manufactured in accordance with the present invention includes a substrate 10, a local-interconnect structure 12, and a metal-interconnect structure 14. Silicon substrate 10 has been doped to define active circuit regions such as source 20, drain 22, and channel 24. Local interconnect structure 12 includes a tungsten source contact 30, a tungsten drain contact 32, a polysilicon gate 34, a gate oxide 36, and a silicon dioxide submetal dielectric 38.

Metal interconnect structure 14 includes a first metal layer 40, an intermetal dielectric layer 42, a second metal layer 44, and a passivation layer 46. First metal layer 40 defines first metal layer conductors 50 and contact vias 52. First metal layer 40 comprises a first tantalum barrier sublayer 54 and a first copper bulk-conductor sublayer 56. Likewise, second metal layer 44 defines second metal layer conductors 60 and intermetal vias 62. Second metal layer comprises a second tantalum barrier sublayer 64 and a second copper bulk-conductor sublayer 66. Intermetal dielectric layer 42 includes a silicon nitride barrier sublayer 70 and a silicon dioxide bulk dielectric sublayer 72. Passivation layer 46 is silicon nitride.

Figure 2:
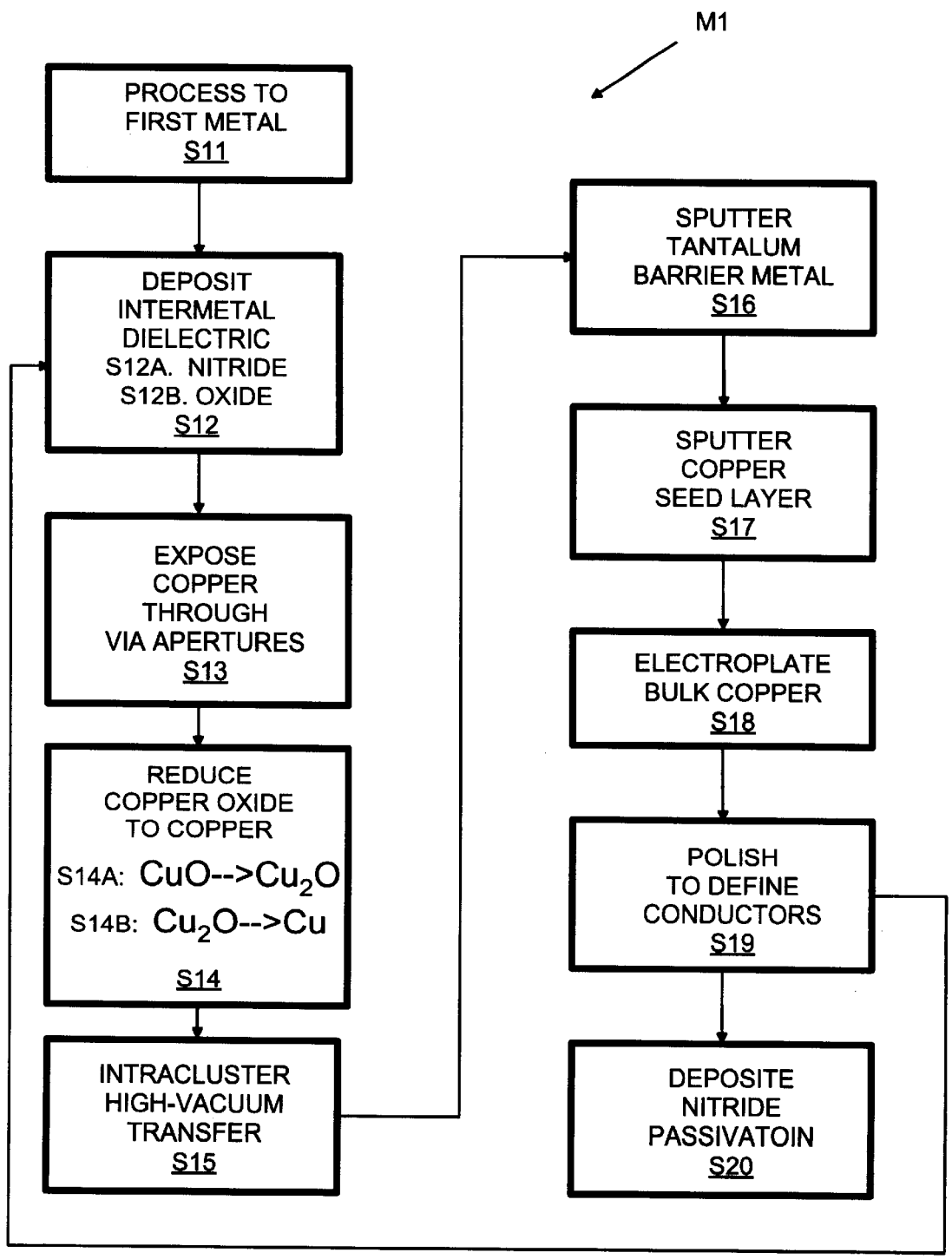
FIG. 2 is a flow chart of the method of the invention.

A method M1 of the invention is flow charted in FIG. 2. Multi-part step S11 involves fabricating integrated circuit AP1 through formation of first metal layer 40 (FIG. 1). Briefly, step S11 involves defining active regions of substrate 10, forming local interconnect structure 12, and formation of first metal layer 40 according to a damascene process (detailed below in connection with the description of the process for forming second metal layer 44). Intermetal dielectric layer 42 is deposited at step S12. This deposition is performed in two substeps. Substep S12A involves deposition of a silicon-nitride barrier sublayer 70. Silicon nitride sublayer 70 serves as a migration barrier for the copper of first metal layer 40. Silicon dioxide sublayer 72 is deposited at substep S12B to provide the bulk of intermetal dielectric layer 42.

Figure 3:
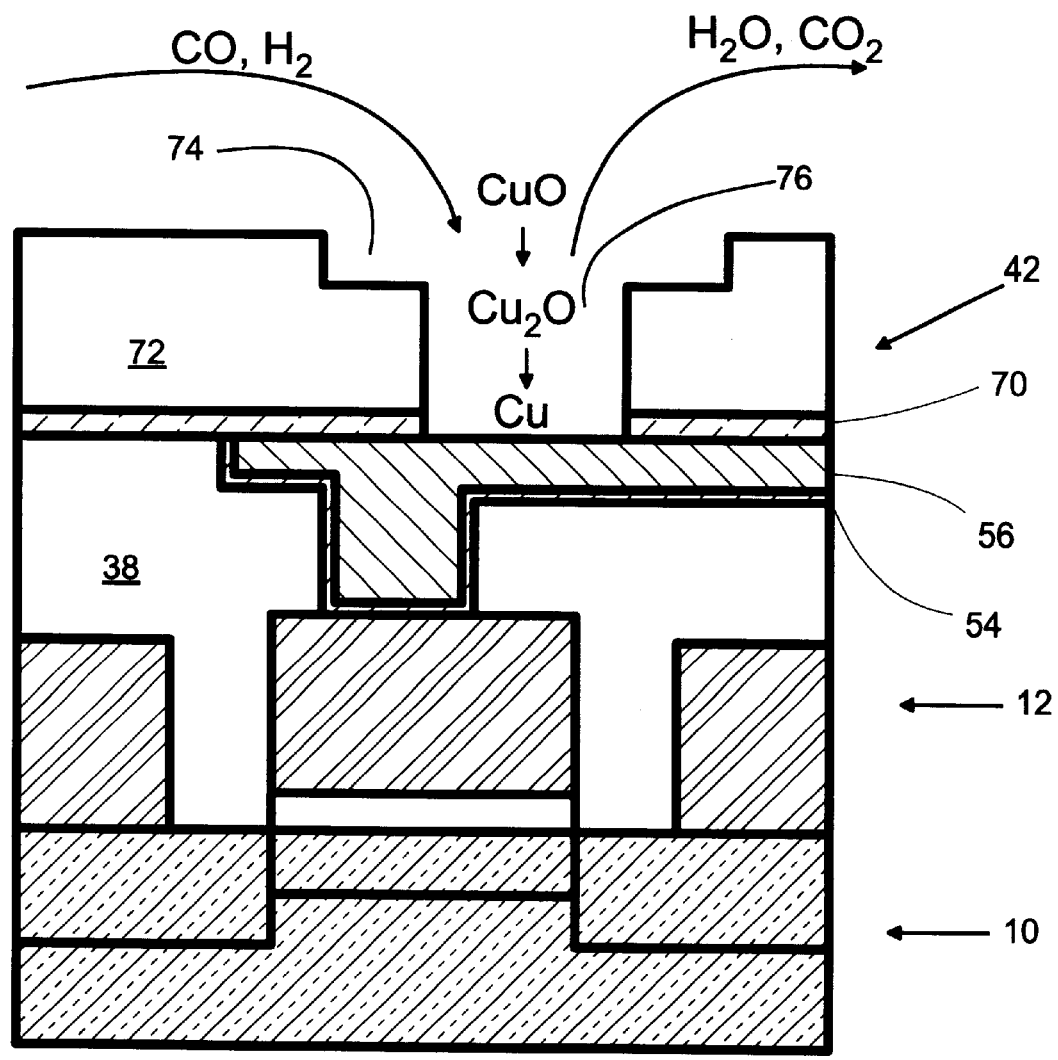
FIG. 3 is a schematic illustration of the integrated circuit of FIG. 1 during a reduction step of the method of FIG. 2.

Intermetal dielectric layer 42 is photolithographically patterned at step S13 to define trenches 74 (that will contain second metal conductors 60) and via apertures 76 (that will contain intermetal layer vias 62), as shown in FIG. 3. The bulk of material removed in intermetal dielectric patterning step S13 is silicon dioxide, however, silicon nitride at the base of the via apertures is removed to expose an area of first copper sublayer 56.

In accordance with the present invention, exposed copper 56 is subject to a reduction reaction at step S14 to remove any oxidation formed on the exposed copper. Such oxidation would greatly increase the resistance of the via to be formed, impairing device performance or preventing it from functioning. This reduction step involves flowing a reducing agent over the structure of FIG. 3. The reducing agent removes the oxidation, while the flowing gas helps dislodge contaminants on the copper.

The reducing agent can be hydrogen ($H_2$) or carbon monoxide (CO). The temperature range can be 350° C. to 450° C., preferably about 400° C., to remain within the thermal budget for manufacturing integrated circuit AP1. Pressure is non-critical as far as the reduction reaction is concerned. However, a pressure in the range of 1–5 millitorrs, preferably 2 millitorrs, can be used so that less pump down is required to achieve a high vacuum for a subsequent transfer of the integrated circuit structure.

Reduction step S14 provides for a two-step reaction reaction: substep S14A provides for reduction of black copper oxide (CuO) to red copper oxide; substep S14B provides for reduction of the intermediate red copper oxide ($Cu_2O$) to copper. Suitable reducing agents for achieving this reduction within the specified temperature range are carbon monoxide (CO) and hydrogen ($H_2$). The reaction sequences are:

for $H_2$: 

for CO: 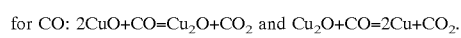

Figure 4:
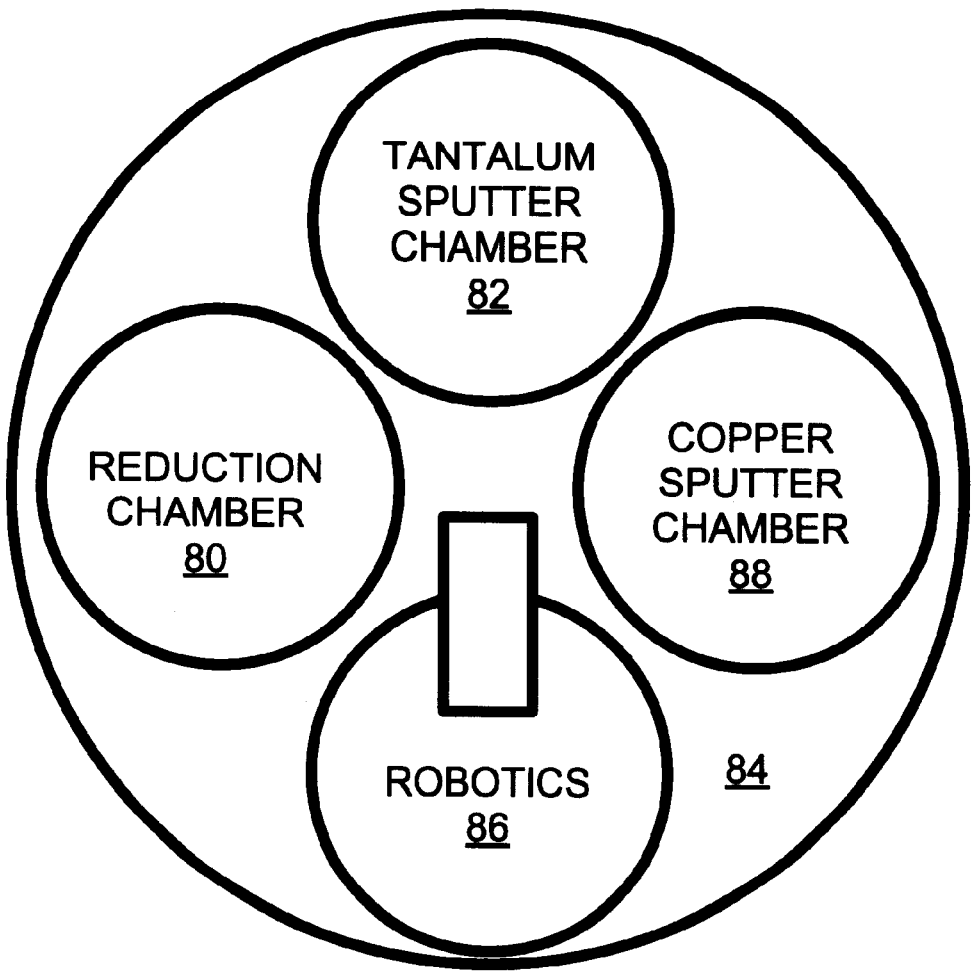
FIG. 4 is a schematic illustration of a chamber cluster used for a transfer step of the method of FIG. 2.

An inter-chamber, intra-cluster wafer transfer is then performed under a high vacuum at step S15. Steps S14 and S16 (to be described) are preferably performed in two chamber systems 80 and 82 that are part of a common cluster 84 of chambers sharing a controllable inter-chamber environment, as shown in FIG. 4. Preparation for the transfer involves pumping down reduction chamber 80 to match a high vacuum maintained in the common cluster environment. Robotics 86 then transfers the integrated-circuit structure to tantalum sputtering chamber 82. This high vacuum transfer prevents re-oxidation of the exposed copper before tantalum sublayer 64 is deposited.

Tantalum is sputtered onto the deoxidized structure at step S16 to form tantalum barrier sublayer 64. After transfer to a third chamber 88 of cluster 84, a thin "seed" layer of copper is sputter deposited at step S17. Copper is then electroplated at step S18 so that it covers the integrated-circuit structure. A chemical-mechanical polish at step S19 removes copper and tantalum to expose dielectric except at conductors 60 and vias 62, thus establishing the second level of metal. A silicon nitride passivation is deposited at step S20, completing method M1 and resulting in integrated circuit AP1 of FIG. 1.

Method M1 results in two levels of metal. To provide for more levels of metal, steps S12–S19 can be reiterated once for each additional level of metal. Step S20 is performed once after the last iteration to provide passivation.

First metal layer 40 is formed in step S11 in the same manner as second metal layer 44, generally as indicated in steps S12–S19, except that the dielectric involved is submetal dielectric layer 38 instead of an intermetal dielectric and contact apertures expose tungsten and polysilicon instead of copper. Accordingly, no reduction step is used to prepare for deposition of first metal layer 40.

Reduction step S14 uses both carbon monoxide and hydrogen as reducing agents to attain the advantages of each. However, alternative embodiments employ carbon monoxide exclusively, while other embodiments employ water vapor exclusively. These and other variations upon and modifications to are provided for by the present invention, the scope of which is defined by the following claims.

What is claimed is:

1. In a method of fabricating an integrated circuit, the steps of:

forming a patterned metal layer including copper;

forming a dielectric layer over said metal layer with apertures exposing some of said copper;

exposing said integrated circuit to an ambient including a reducing agent for copper oxide at a temperature above 300° C.; and depositing metal in said apertures.

2. A method as recited in claim 1 wherein said exposing step produces $Cu_2O$ as an intermediate product.

3. A method as recited in claim 1 wherein said reducing agent includes both carbon monoxide and hydrogen.

4. A method as recited in claim 1 wherein said reducing agent includes carbon monoxide.

5. A method as recited in claim 1 wherein said reducing agent includes hydrogen.

6. A method as recited in claim 1 wherein said exposing step is performed at a temperature between 350° C. and 450° C.

7. A method as recited in claim 1 wherein prior to said depositing step, said integrated circuit is transferred in a high vacuum to a sputtering chamber.

8. In a method of fabricating an integrated circuit, the steps of:

forming a patterned metal layer including copper;

forming a dielectric layer over said metal layer with apertures exposing some of said copper;

exposing said integrated circuit to an ambient including a reducing agent for reducing copper oxide to elemental copper at a temperature above 300° C.; and depositing metal in said apertures.

9. A method as recited in claim 8 wherein said reducing agent includes carbon monoxide.

10. A method as recited in claim 8 wherein said reducing agent includes hydrogen.

\* \* \* \* \*